US010431756B2

(12) United States Patent
Fujioka et al.

(10) Patent No.: US 10,431,756 B2
(45) Date of Patent: Oct. 1, 2019

(54) DISPLAY DEVICE

(71) Applicant: Japan Display Inc., Minato-ku (JP)

(72) Inventors: Takahiro Fujioka, Minato-ku (JP); Kengo Kato, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/007,391

(22) Filed: Jun. 13, 2018

(65) Prior Publication Data

US 2018/0366664 A1    Dec. 20, 2018

(30) Foreign Application Priority Data

Jun. 15, 2017    (JP) .................................. 2017-117412

(51) Int. Cl.
*H01L 51/00* (2006.01)
*H01L 27/32* (2006.01)
*H01L 51/52* (2006.01)

(52) U.S. Cl.
CPC ...... *H01L 51/0097* (2013.01); *H01L 27/3276* (2013.01); *H01L 51/5237* (2013.01); *H01L 2251/5338* (2013.01)

(58) Field of Classification Search
CPC ............. H01L 51/0097; H01L 51/5237; H01L 27/3276
See application file for complete search history.

(56) References Cited

U.S. PATENT DOCUMENTS

| | | | |
|---|---|---|---|
| 8,704,762 B2 * | 4/2014 | Anno | G06F 3/041 345/156 |
| 2010/0085320 A1 * | 4/2010 | Kuwajima | G02F 1/13338 345/173 |
| 2015/0092362 A1 * | 4/2015 | Ahn | H05K 1/189 361/749 |
| 2016/0172428 A1 | 6/2016 | Song et al. | |
| 2017/0365650 A1 * | 12/2017 | Kwon | H01L 27/3253 |
| 2017/0371194 A1 * | 12/2017 | Tomioka | G02F 1/133305 |
| 2017/0371195 A1 * | 12/2017 | Tomioka | G02F 1/13452 |
| 2018/0306968 A1 * | 10/2018 | Matsubara | G02B 6/0055 |
| 2018/0307368 A1 * | 10/2018 | Koide | G02F 1/13338 |
| 2019/0075656 A1 * | 3/2019 | Kim | H05K 1/147 |

* cited by examiner

*Primary Examiner* — Joseph C. Nicely
(74) *Attorney, Agent, or Firm* — Oblon, McClelland, Maier & Neustadt, L.L.P.

(57) ABSTRACT

There is provided a display device including an organic light-emitting diode structure layer including a pixel array section, a film connected to a first edge-side region of the organic light-emitting diode structure layer and folded back onto a rear surface side of the organic light-emitting diode structure layer, and an integrated circuit disposed on the film. A width of the film in a connection region to the organic light-emitting diode structure layer is smaller than a width of the film in a region where the integrated circuit is disposed.

10 Claims, 5 Drawing Sheets

DISPLAY DEVICE

CROSS-REFERENCE TO RELATED APPLICATION

The present application claims priority from the Japanese Application JP2017-117412 filed on Jun. 15, 2017, the content of which is hereby incorporated by reference into this application.

BACKGROUND OF THE INVENTION

1. Field of the Invention

The present invention relates to a display device.

2. Description of the Related Art

A flat panel display such as an organic electroluminescence (EL) display device includes a display panel in which thin film transistors (TFTs), organic light-emitting diodes (OLEDs), and the like are formed on a substrate. A glass substrate has been conventionally used for a base material of the display panel. In recent years, however, a flexible display in which the display panel can be bent is being developed with use of a resin film or the like such as a polyimide film for the base material.

As applications of the flexible display, it is considered to achieve a narrower picture frame by folding a chip on film (COF), which is provided outside an image display region of the display panel and includes an integrated circuit (IC) mounted on a resin film, to the rear side of the image display region.

In U.S. Patent Application Publication No. 2016/0172428, a COF is connected to the lower edge side of an organic light-emitting diode structure layer including a pixel array section, and a portion of the COF is curved, thereby causing the other portion of the COF to be folded back onto the rear side of the image display region. Further, U.S. Patent Application Publication No. 2016/0172428 discloses a configuration in which a curved region is provided also in a left edge region and a right edge region of the organic light-emitting diode structure layer.

SUMMARY OF THE INVENTION

However, the conventional configuration described above has a low degree of freedom in designing the width of the curved region in the left edge region and the right edge region of the organic light-emitting diode structure layer, that is, in a second edge-side region and a third edge-side region that cross a first edge side at which the organic light-emitting diode structure layer is connected with a film such as a COF. In the conventional configuration described above, a plurality of wiring lines are disposed on the film. The wiring lines are disposed bypassing the arrangement region of the integrated circuit mounted on the film. Therefore, the horizontal width of the film needs to be widely formed according to a wiring-line forming region disposed bypassing the arrangement region of the integrated circuit. When the horizontal width of the film becomes wide, a connection section to the film on the first edge-side region of the image display region is widened. As described above, the film is folded back onto the rear surface side. Therefore, when it is intended to curve the second and third edge-side regions in the image display region so as to include the film, bending occurs in two directions in the film, and thus this is not practical because a large stress is applied to the film. Therefore, the width of the curved region in the second and third edge-side regions of the organic light-emitting diode structure layer is limited by the connection width between the film and the image display region, which reduces the degree of freedom in design.

The invention has been made in view of the above problem, and it is an object of the invention to improve the degree of freedom in designing the width of a curved region in second and third edge-side regions of an organic light-emitting diode structure layer.

According to one aspect of the present invention, there is provided a display device including an organic light-emitting diode structure layer including a pixel array section, a film connected to a first edge-side region of the organic light-emitting diode structure layer and folded back onto a rear surface side of the organic light-emitting diode structure layer, and an integrated circuit disposed on the film. A width of the film in a connection region to the organic light-emitting diode structure layer is smaller than a width of the film in a region where the integrated circuit is disposed.

In the above-mentioned aspects of the invention, the organic light-emitting diode structure layer includes a second edge-side region and a third edge-side region that cross the first edge side, and the second edge-side region and the third edge-side region are curved.

In the above-mentioned aspects of the invention, a region of the film that overlaps the second edge-side region and a second region of the film that overlaps the third edge-side region in a plan view are curved in the same direction as a curvature direction of the second edge-side region and the third edge-side region.

In the above-mentioned aspects of the invention, the second edge-side region and the third edge-side region do not overlap the connection region between the organic light-emitting diode structure layer and the film in the plan view.

In the above-mentioned aspects of the invention, curvature axes of the second edge-side region and the third edge-side region cross the first edge side.

In the above-mentioned aspects of the invention, the display device further includes a drive power supply line disposed on the film and connected to a drive power supply circuit included in the organic light-emitting diode structure layer. The drive power supply line includes a bent section bending in a direction away from an arrangement position of the integrated circuit.

In the above-mentioned aspects of the invention, the display device further includes an FPC connected to the film. The FPC is connected to an edge-side of the film that opposes the connection region to the organic light-emitting diode structure layer.

In the above-mentioned aspects of the invention, a width of the film in a connection region to the FPC is smaller than the width of the film in the region where the integrated circuit is disposed.

In the above-mentioned aspects of the invention, the organic light-emitting diode structure layer includes a second edge-side region and a third edge-side region that cross the first edge side. The second edge-side region and the third edge-side region are curved. The second edge-side region and the third edge-side region do not overlap the connection region between the FPC and the film in a plan view.

In the above-mentioned aspects of the invention, the display device further includes a cover glass provided on a front surface side of the organic light-emitting diode structure layer. A region of the cover glass that overlaps the second edge-side region and a second region of the cover glass that overlaps the third edge-side region in a plan view are curved in the same direction as a curvature direction of the second edge-side region and the third edge-side region.

DETAILED DESCRIPTION OF THE INVENTION

Figure 1:
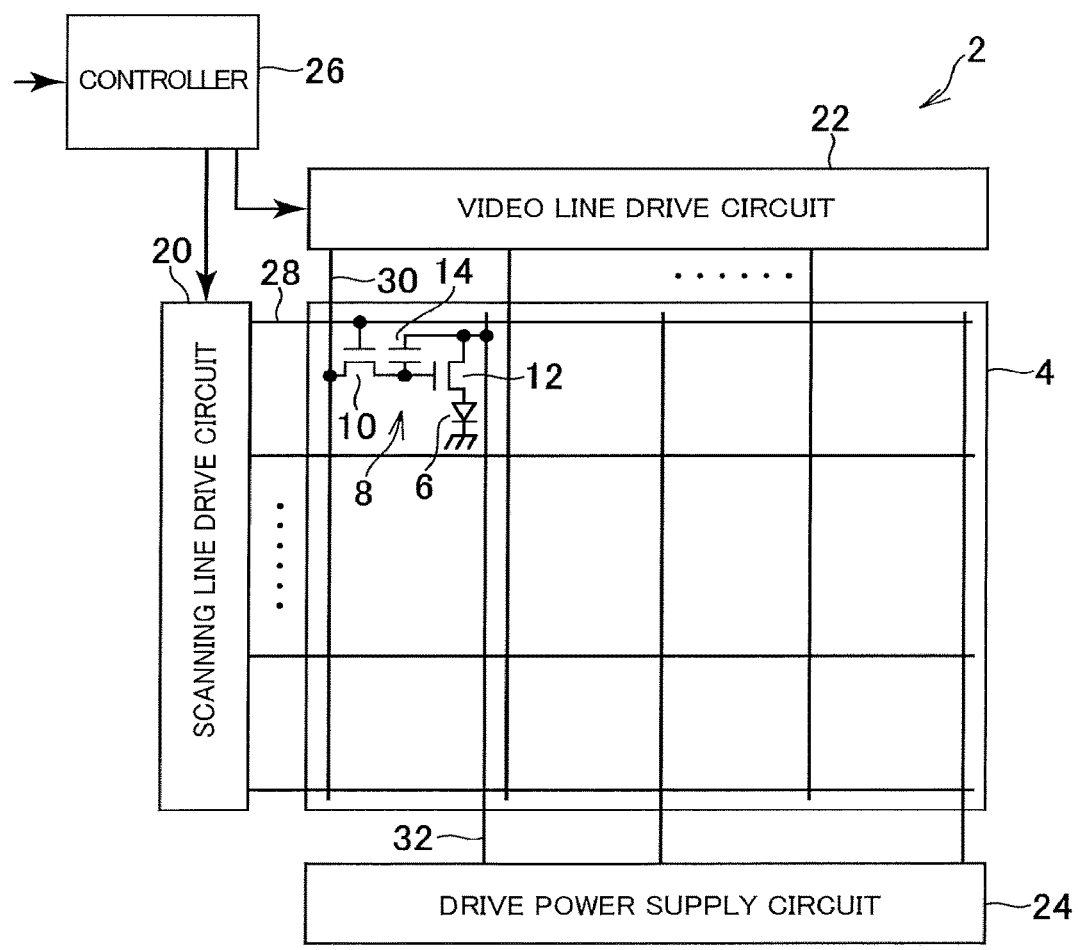
FIG. 1 is a schematic view showing a schematic configuration of a display device according to an embodiment.

Hereinafter, an embodiment of the invention will be described based on the drawings.

The disclosure is illustrative only. Appropriate modifications that will readily occur to those skilled in the art and fall within the spirit of the invention are of course included in the scope of the invention. In the drawings, for more clarity of description, the width, thickness, shape, and the like of each part may be schematically represented, compared to those in practicing aspects of the invention. However, they are illustrative only, and do not limit the interpretation of the invention. Moreover, in the specification and the drawings, elements similar to those described in relation to a previous drawing are denoted by the same reference numerals and signs, and a detailed description may be appropriately omitted. Further, unless otherwise noted, embodiments of the invention can be combined with each other.

A display device 2 according to the embodiment is, for example, an organic electroluminescent display device, and is mounted in a television set, a personal computer, a portable terminal, a mobile phone, and the like. FIG. 1 is a schematic view showing a schematic configuration of the display device 2 according to the embodiment. The display device 2 includes a pixel array section 4 that displays an image, and a drive section that drives the pixel array section 4. The display device 2 may include a base material made of glass or the like. The display device 2 may be a flexible display having flexibility, in which case the display device 2 may include a base material made of a resin film or the like having flexibility. The display device 2 includes a wiring layer including wiring lines provided within or above the base material.

In the pixel array section 4, organic light-emitting diodes 6 and pixel circuits 8 are disposed in a matrix so as to correspond to pixels. The pixel circuit 8 includes a lighting thin film transistor (TFT) 10, a drive TFT 12, and a capacitor 14.

On the other hand, the drive section includes a scanning line drive circuit 20, a video line drive circuit 22, a drive power supply circuit 24, and a controller 26. The drive section drives the pixel circuit 8 and controls emission of the organic light-emitting diode 6.

The scanning line drive circuit 20 is connected to scanning signal lines 28 each provided for an array of pixels in the horizontal direction (a pixel row). The scanning line drive circuit 20 sequentially selects the scanning signal line 28 in response to a timing signal input from the controller 26, and applies a voltage for turning on the lighting TFT 10 to the selected scanning signal line 28.

The video line drive circuit 22 is connected to video signal lines 30 each provided for an array of pixels in the vertical direction (a pixel column). The video line drive circuit 22 receives a video signal from the controller 26, and outputs, in synchronization with the selection of the scanning signal line 28 by the scanning line drive circuit 20, a voltage in response to the video signal of the selected pixel row to each of the video signal lines 30. The voltage is written to the capacitor 14 via the lighting TFT 10 in the selected pixel row. The drive TFT 12 supplies a current in response to the written voltage to the organic light-emitting diode 6, and thus the organic light-emitting diode 6 of the pixel corresponding to the selected scanning signal line 28 emits light.

The drive power supply circuit 24 is connected to drive power supply lines 32 each provided for the pixel column, and supplies a current to the organic light-emitting diode 6 via the drive power supply line 32 and the drive TFT 12 in the selected pixel row.

Here, a lower electrode of the organic light-emitting diode 6 is connected to the drive TFT 12. On the other hand, upper electrodes of the organic light-emitting diodes 6 are composed of an electrode common to the organic light-emitting diodes 6 of all pixels. When the lower electrode is configured as an anode, a high potential is input thereto and a low potential is input to the upper electrode that serves as a cathode. When the lower electrode is configured as a cathode, a low potential is input thereto and a high potential is input to the upper electrode that serves as an anode.

Figure 2:
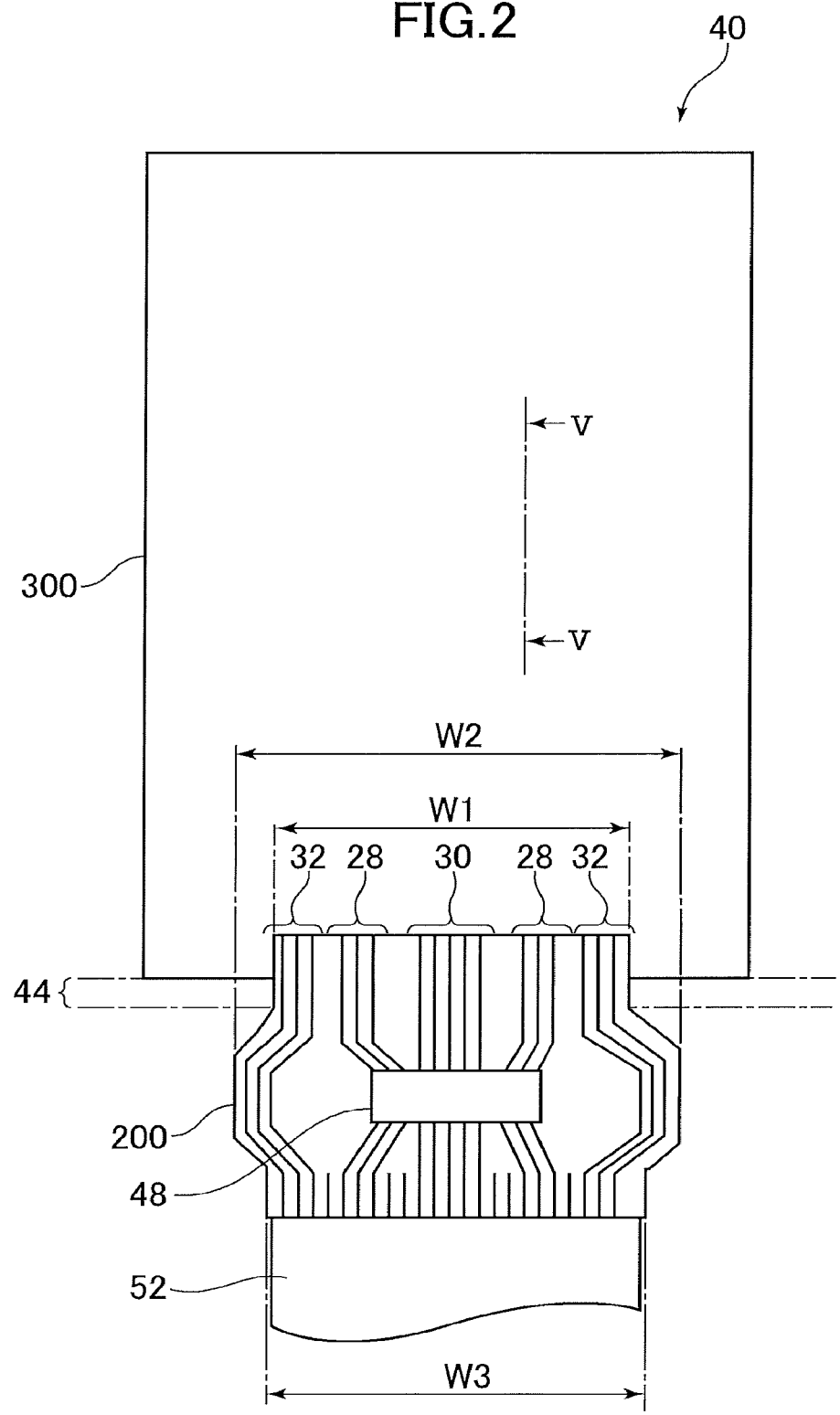
FIG. 2 is a schematic plan view showing the front surface side of a display panel of the display device according to the embodiment.

FIG. 2 is a schematic plan view showing the front surface side of a display panel 40 of the display device 2 in the embodiment. As shown in FIG. 2, the display panel 40 includes an organic light-emitting diode structure layer 300 including the pixel array section 4, and a film 200 connected to a first edge-side region (lower edge side in the embodiment) of the organic light-emitting diode structure layer 300.

An integrated circuit 48 is disposed on the front surface side of the film 200. The film 200 is made of, for example, resin such as polyimide. The film 200 and the integrated circuit 48 constitute a COF.

The embodiment is configured such that a flexible printed circuit (FPC) 52 is connected to an edge-side (lower edge side in the embodiment) of the film 200 that opposes a connection region (upper edge side in the embodiment) thereof to the organic light-emitting diode structure layer 300. The FPC 52 is electrically connected to the scanning line drive circuit 20, the video line drive circuit 22, the drive power supply circuit 24, the controller 26, and the like, which are described above.

The drive power supply lines 32 extend on the left edge and the right edge of the film 200, and connect the drive power supply circuit 24 in the organic light-emitting diode structure layer 300 with the FPC 52 without passing through the integrated circuit 48. The drive power supply line 32 includes a bent section for bypassing the arrangement region of the integrated circuit 48. That is, the drive power supply line 32 includes the bent section, which bends in a direction away from the arrangement position of the integrated circuit 48. Here, as shown in FIG. 2, the bent angle of the bent section does not need to be 90 degrees, and it is sufficient that the bent section bends in the direction away from the arrangement position of the integrated circuit 48.

The video signal lines 30 extend on substantially the center of the film 200, pass through the integrated circuit 48, and connect the video line drive circuit 22 in the organic light-emitting diode structure layer 300 with the FPC 52.

The scanning signal lines 28 extend between the drive power supply line 32 and the video signal line 30 on the film 200, pass through the integrated circuit 48, and connect the scanning line drive circuit 20 in the organic light-emitting diode structure layer 300 with the FPC 52.

A horizontal width W2 of the film 200 in a region where the integrated circuit 48 is disposed needs to be widely formed according to the forming region of the drive power supply lines 32 disposed bypassing the arrangement region of the integrated circuit 48.

Here, in the embodiment, the film 200 is configured such that a horizontal width W1 of the connection region of the film 200 to the organic light-emitting diode structure layer 300 is smaller than the horizontal width W2 of the film 200 in the region where the integrated circuit 48 is disposed. Moreover, in the embodiment, the film 200 is configured such that a horizontal width W3 of the film 200 in a region connected to the upper edge of the FPC 52 is smaller than the horizontal width W2.

Although not shown for convenience sake in FIG. 2, the embodiment is configured such that a cover glass is provided on the front surface side of the organic light-emitting diode structure layer 300.

The upper edge side of the film 200 connected to the organic light-emitting diode structure layer 300 shown in FIG. 2 is a curved region 44. A portion of the film 200 that is located on the lower side of the curved region 44 and the FPC 52 are folded back onto the rear surface side of the organic light-emitting diode structure layer 300.

Figure 3:
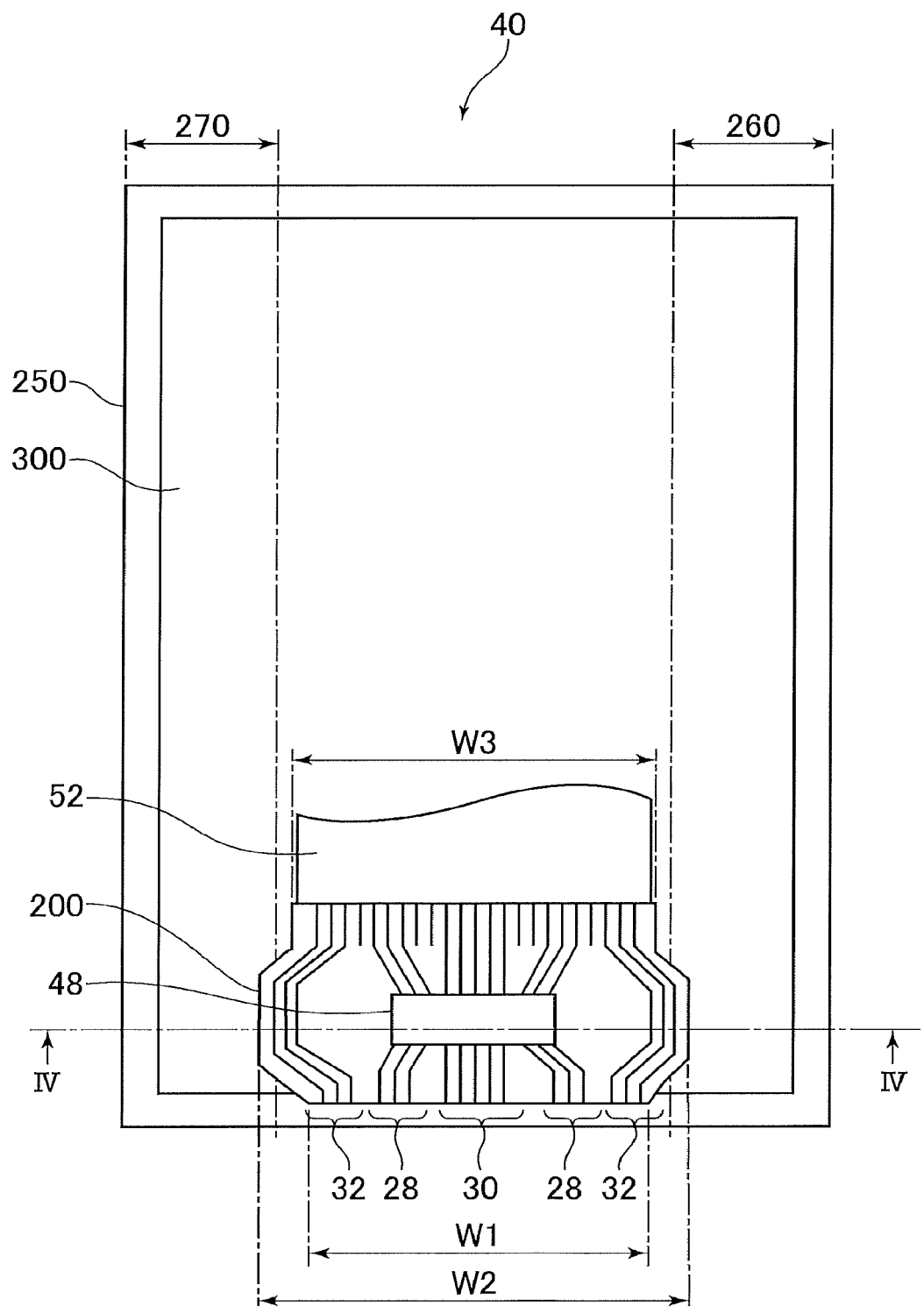
FIG. 3 is a schematic plan view showing the rear surface side of the display panel of the display device according to the embodiment in a state where the display panel is folded back at a curved region.

FIG. 3 is a schematic plan view showing the rear surface side of the display panel 40 of the display device 2 in the embodiment in a state where the display panel 40 is folded back at the curved region 44. As shown in FIG. 3, most of the film 200 folded back at the curved region 44 and the FPC 52 are disposed on the rear surface side of the organic light-emitting diode structure layer 300. The integrated circuit 48 disposed on the front surface side of the film 200 is also disposed on the rear surface side of the organic light-emitting diode structure layer 300 as the film 200 is folded back onto the rear surface side.

As shown in FIG. 3, a cover glass 250 having an area larger than the organic light-emitting diode structure layer 300 is provided on the front surface side of the organic light-emitting diode structure layer 300, and a portion of the cover glass 250 is exposed from the rear surface side of the organic light-emitting diode structure layer 300.

The display panel 40 of the disclosure is configured such that a second edge-side region (a left edge region 260 in the embodiment) and a third edge-side region (a right edge region 270 in the embodiment) that cross the first edge side are curved. The curvature axes of the second edge-side region and the third edge-side region cross the first edge side, and in the embodiment, the curvature axes are orthogonal thereto.

Figure 4:
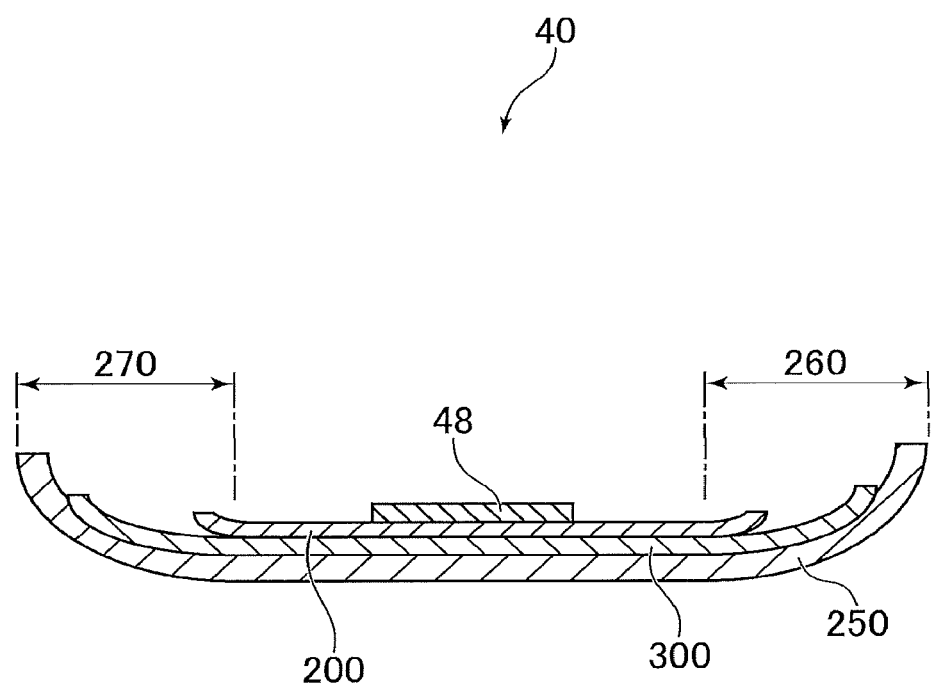
FIG. 4 is a schematic vertical sectional view of an organic light-emitting diode structure layer at a position along line IV-IV shown in FIG. 3.

FIG. 4 is a schematic vertical sectional view of the organic light-emitting diode structure layer 300 at a position along line IV-IV shown in FIG. 3, showing a curved state of the left edge region 260 and the right edge region 270 of the organic light-emitting diode structure layer 300.

As shown in FIGS. 3 and 4, the cover glass 250 is configured such that the regions thereof overlapping the left edge region 260 and the right edge region 270 of the organic light-emitting diode structure layer 300 in a plan view are curved in the same direction as the curvature direction of the left edge region 260 and the right edge region 270 of the organic light-emitting diode structure layer 300. Similarly, the film 200 is configured such that the regions thereof overlapping the left edge region 260 and the right edge region 270 of the organic light-emitting diode structure layer 300 in the plan view are curved in the same direction as the curvature direction of the left edge region 260 and the right edge region 270 of the organic light-emitting diode structure layer 300.

Here, as described above with reference to FIG. 2, the horizontal width W2 of the film 200 in the region where the integrated circuit 48 is disposed needs to be widely formed according to the wiring-line forming region disposed bypassing the arrangement region of the integrated circuit 48.

However, in the disclosure as shown in FIGS. 2 and 3, the film 200 is configured to include a constriction so that the horizontal width W1 of the connection region of the film 200 to the organic light-emitting diode structure layer 300 is smaller than the horizontal width W2 of the film 200 in the region where the integrated circuit 48 is disposed.

Therefore, when making a design in which the occurrence of bending in two directions in the film 200 is suppressed, the bent regions of the left edge region 260 and the right edge region 270 can be freely formed to such an extent that the bent regions do not overlap the connection region having the horizontal width W1 smaller than the horizontal width W2 in a plan view. As a result, it is possible to improve the degree of freedom in designing the width of the curved region in the left edge region 260 and the right edge region 270 of the organic light-emitting diode structure layer.

Further, as described above with reference to FIG. 2, the film 200 is configured such that the horizontal width W3 of the film 200 in the region connected to the upper edge of the FPC 52 is smaller than the horizontal width W2.

Here, in view of connection reliability between the FPC 52 and the film 200, it is desirable that the connection region between the FPC 52 and the film 200 does not overlap the bent regions of the left edge region 260 and the right edge region 270 in a plan view in the state where the film 200 is folded back at the curved region 44 onto the rear surface side of the organic light-emitting diode structure layer 300 as shown in FIG. 3.

With regard to this problem, according to the configuration of the embodiment, the bent regions of the left edge region 260 and the right edge region 270 can be freely formed to such an extent that the bent regions do not overlap the connection region having the horizontal width W3 smaller than the horizontal width W2 of the film 200 in the region where the integrated circuit 48 is disposed. As a result, it is possible to improve the degree of freedom in designing the width of the curved region in the left edge region 260 and the right edge region 270 of the organic light-emitting diode structure layer.

Figure 5:
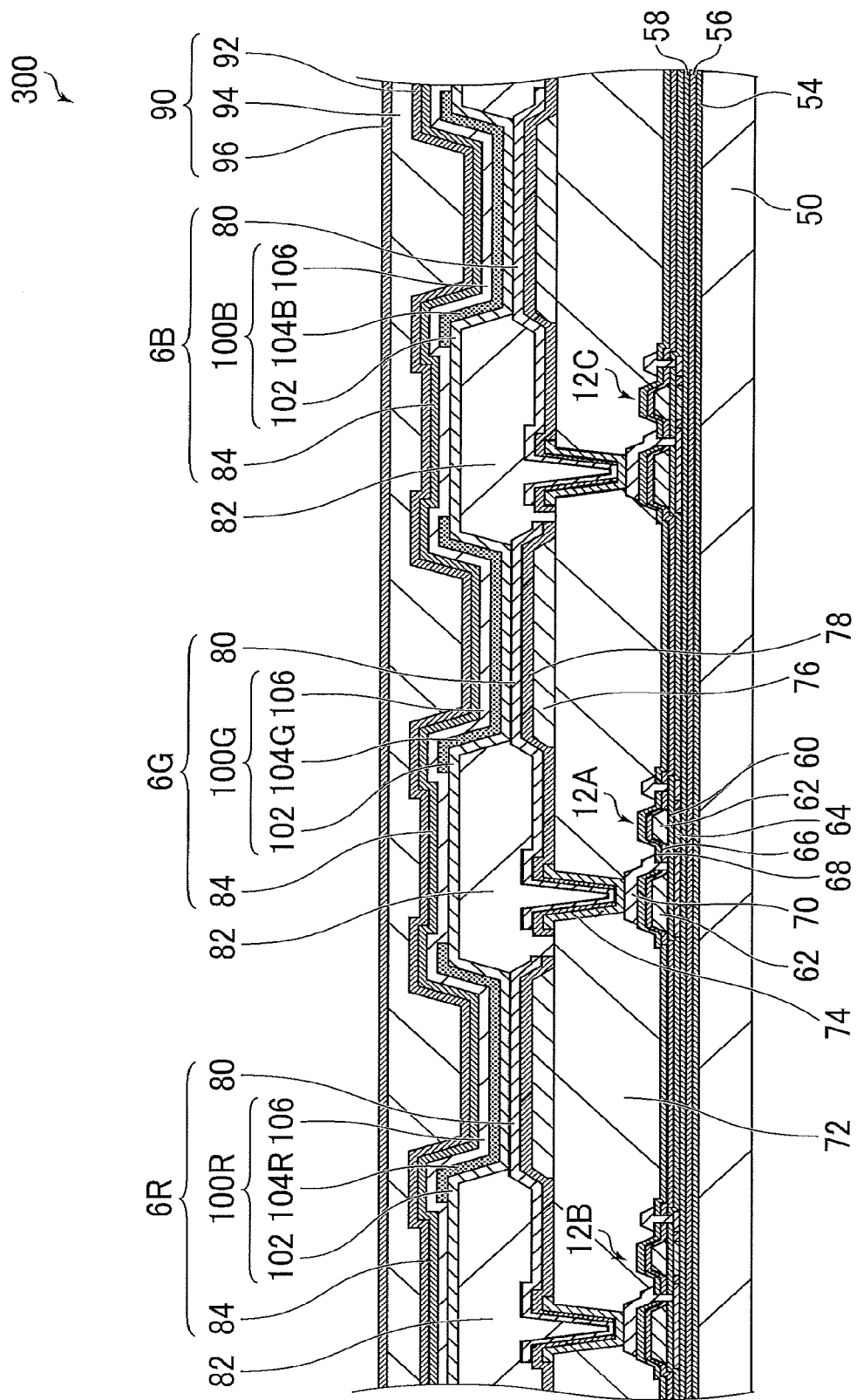
FIG. 5 is a schematic vertical sectional view of the organic light-emitting diode structure layer at a position along line V-V shown in FIG. 2.

Hereinafter, a specific structure of the organic light-emitting diode structure layer 300 in the embodiment will be exemplified with reference to FIG. 5. FIG. 5 is a schematic vertical sectional view of the organic light-emitting diode structure layer 300 at a position along line V-V shown in FIG. 2. As shown in FIG. 5, the organic light-emitting diode structure layer 300 of the embodiment includes an array substrate 50. In the embodiment, polyimide is used as a material constituting the array substrate 50. However, other resin materials may be used as the material constituting the array substrate 50 when a base material has sufficient flexibility as a sheet display.

A three-layer stacked structure including a first silicon oxide film 54, a first silicon nitride film 56, and a second silicon oxide film 58 is provided as an undercoat layer above the array substrate 50. The first silicon oxide film 54 in the lowermost layer is provided to improve the adhesion to the array substrate 50. The first silicon nitride film 56 in the middle layer is provided as a block film for moisture and impurities from the outside. The second silicon oxide film 58 in the uppermost layer is provided as a block film to prevent hydrogen atoms contained in the first silicon nitride film 56 from diffusing to the semiconductor layer side. The undercoat layer is not particularly limited to this structure. The undercoat layer may have a structure including a further stacked layer, or may have a single-layer structure or a two-layer structure.

A first drive TFT 12A, a second drive TFT 12B, and a third drive TFT 12C are provided above the undercoat layer. Each of the drive TFTs 12 has a structure in which a low-concentration impurity region is provided between a channel region and a source-drain region. In the embodiment, a silicon oxide film is used as a gate insulating film 60, and a first wiring line 62 formed of a stacked structure of Ti and Al is used as a gate electrode. The first wiring line 62 functions as a storage capacitance line in addition to its function as the gate electrode of the drive TFT 12. That is, the first wiring line 62 is used to form a storage capacitance between a polysilicon film 64 and the first wiring line 62.

Above the drive TFT 12, a second silicon nitride film 66 serving as an interlayer insulating film and a third silicon oxide film 68 are stacked, and further, a second wiring line 70 serving as a source-drain electrode and a routing wiring line is formed. In the embodiment, the second wiring line 70 is configured to have a three-layer stacked structure of Ti, Al, and Ti. A storage capacitance is formed by an electrode formed of the interlayer insulating film, a conductive layer in the same layer as the first wiring line 62, and an electrode formed of a conductive layer in the same layer as a source-drain wiring line of the drive TFT 12. The routing wiring line is extended to the edge of perimeter of the array substrate 50, and forms a terminal to connect the FPC 52 or the integrated circuit 48 shown in FIG. 2.

A planarization film 72 is formed above the drive TFT 12. As the planarization film 72, an organic material such as a photosensitive acrylic resin is used in many cases. The planarization film 72 has excellent surface flatness compared to an inorganic insulating material formed by a chemical vapor deposition (CVD) method or the like. The planarization film 72 is removed in a pixel contact section and a peripheral region. The upper surface of the second wiring line 70 exposed by the removal of the planarization film 72 is covered by a transparent conductive film 74 made of indium tin oxide (ITO).

Subsequently, a third wiring line 76 is provided in the same layer as the transparent conductive film 74. In the embodiment, the third wiring line 76 is provided to have a three-layer stacked structure of Mo, Al, and Mo, and is used to form a peripheral routing wiring line or a capacitive element additionally provided in a pixel. Covering the upper surface of the second wiring line 70 exposed after removing the planarization film 72 with the transparent conductive film 74, as mentioned above, also means to protect the exposed surface of the second wiring line 70 from a patterning step of the third wiring line 76. The transparent conductive film 74 and the upper surface of the third wiring line 76 are temporarily covered with a third silicon nitride film 78. Thereafter, in the pixel contact section of the transparent conductive film 74, an opening is provided in the third silicon nitride film 78, and a portion of the upper surface of the transparent conductive film 74 is exposed.

In the embodiment, layers from the layer in which the first wiring line 62 described above is present to the layer in which the third wiring line 76 is present are defined as a wiring layer 86.

Thereafter, a lower electrode 80 serving as a pixel electrode is formed so as to be connected to the upper surface of the transparent conductive film 74 exposed through the opening. In the embodiment, the lower electrode 80 is formed as a reflecting electrode, and has a three-layer stacked structure made of ITO, Ag, and ITO. In the pixel contact section, an additional capacitance is formed by the transparent conductive film 74, the third silicon nitride film 78, and the lower electrode 80. Incidentally, the transparent conductive film 74 is partially exposed to an etching environment during the patterning of the lower electrode 80; however, the transparent conductive film 74 has resistance to etching of the lower electrode 80 through an annealing treatment performed during the period from after a forming step of the transparent conductive film 74 to a forming step of the lower electrode 80.

After the forming step of the lower electrode 80, an insulating film 82 called a bank or a rib and serving as a partition wall of a pixel region is formed. As the insulating film 82, a photosensitive acrylic resin or the like is used in the same manner as for the planarization film 72. The insulating film 82 is opened so as to expose the upper surface of the lower electrode 80 as a light-emitting region, and the opening edge preferably has a smooth tapered shape. When the opening edge has a steep shape, a coverage defect of an organic layer 100 to be formed later occurs. Here, the planarization film 72 and the insulating film 82 include a portion where the planarization film 72 and the insulating film 82 are in contact with each other through the opening provided in the third silicon nitride film 78 intervening therebetween. The opening is provided to extract, through the insulating film 82, the moisture or gas desorbed from the planarization film 72 through a heat treatment or the like after the forming step of the insulating film 82.

After the formation of the insulating film 82, organic materials constituting the organic layer 100 are stacked and formed. As a stacked structure constituting the organic layer 100, a hole transport layer 102, a light-emitting layer 104, and an electron transport layer 106 are stacked and formed in order from the lower electrode 80 side. In the embodiment, the hole transport layer 102 and the electron transport layer 106 are formed over a plurality of sub-pixels, and the light-emitting layer 104 is formed for each sub-pixel. The organic layer 100 may be formed by evaporation, or may be formed by application through dispersion with a solvent. Moreover, the organic layer 100 may be selectively formed for each sub-pixel, or may be formed in the form of a layer over the entire surface covering the display region. When the organic layer 100 is formed in the form of a layer, the display device can be configured such that white light is obtained in all sub-pixels and that a desired color wavelength portion is extracted by a color filter (not shown). In the embodiment, a configuration is employed in which the organic layer 100 is selectively formed for each sub-pixel.

After the formation of the organic layer 100, an upper electrode 84 is formed. In the embodiment, a top-emission structure is employed, and therefore, the upper electrode 84 is formed using a transparent conductive material, indium zinc oxide (IZO) as one example. According to the order of formation of the organic layer 100 described above, the lower electrode 80 serves as an anode, and the upper electrode 84 serves as a cathode.

The upper electrode 84, the organic layer 100, and the lower electrode 80 constitute the organic light-emitting diode 6. In the embodiment, the display device 2 includes: a first organic light-emitting diode 6G including, in a first organic layer 100G, a first light-emitting layer 104G that emits green light; a second organic light-emitting diode 6R including, in a second organic layer 100R, a second light-emitting layer 104R that emits red light; and a third organic light-emitting diode 6B including, in a third organic layer 100B, a third light-emitting layer 104B that emits blue light.

The lower electrode 80 of the first organic light-emitting diode 6G is connected to the first drive TFT 12A. The lower electrode 80 of the second organic light-emitting diode 6R is connected to the second drive TFT 12B. The lower electrode 80 of the third organic light-emitting diode 6B is connected to the third drive TFT 12C.

After the formation of the upper electrode 84, a passivation layer 90 is formed. One of the functions of the passivation layer 90 is to prevent the entry of moisture from the outside into the organic layer 100 previously formed, and high gas-barrier properties are required of the passivation layer 90. In the embodiment, a stacked structure of a fourth silicon nitride film 92, an organic resin film 94 made of an acrylic resin or the like, and a fifth silicon nitride film 96 is employed as a stacked structure of the passivation layer 90. Further, the passivation layer 90 may be configured such that a silicon oxide film intervenes between the organic resin film 94 and the fifth silicon nitride film 96.

The embodiment is configured such that the film 200 is connected to the lower edge side of the organic light-emitting diode structure layer 300 and that the left edge region 260 and the right edge region 270 of the organic light-emitting diode structure layer 300 are curved; however, the invention is not limited to this configuration. That is, the invention may be configured such that, irrespective of a display direction of a display region in the organic light-emitting diode structure layer 300, the film 200 is connected to the first edge-side region of the organic light-emitting diode structure layer 300 and that the second edge-side region and the third edge-side region crossing the first edge side are curved.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
   an organic light-emitting diode structure layer including a pixel array section;
   a film connected to a first edge-side region of the organic light-emitting diode structure layer and folded back onto a rear surface side of the organic light-emitting diode structure layer; and
   an integrated circuit disposed on the film, wherein
   a width of the film in a connection region to the organic light-emitting diode structure layer is smaller than a width of the film in a region where the integrated circuit is disposed.

2. The display device according to claim 1, wherein
   the organic light-emitting diode structure layer includes a second edge-side region and a third edge-side region that cross the first edge side region, and
   the second edge-side region and the third edge-side region are curved.

3. The display device according to claim 2, wherein
   a first region of the film that overlaps the second edge-side region and a second region of the film that overlaps the third edge-side region in a plan view are curved in the same direction as a curvature direction of the second edge-side region and the third edge-side region.

4. The display device according to claim 2, wherein
   the second edge-side region and the third edge-side region do not overlap the connection region between the organic light-emitting diode structure layer and the film in the plan view.

5. The display device according to claim 2, wherein
   curvature axes of the second edge-side region and the third edge-side region cross the first edge side region.

6. The display device according to claim 2, further comprising a cover glass provided on a front surface side of the organic light-emitting diode structure layer, wherein
   a first region of the cover glass that overlaps the second edge-side region and a second region of the cover glass that overlaps the third edge-side region in a plan view are curved in the same direction as a curvature direction of the second edge-side region and the third edge-side region.

7. The display device according to claim 1, further comprising a drive power supply line disposed on the film and connected to a drive power supply circuit included in the organic light-emitting diode structure layer, wherein
   the drive power supply line includes a bent section bending in a direction away from an arrangement position of the integrated circuit.

8. The display device according to claim 1, further comprising an FPC connected to the film, wherein
   the FPC is connected to an edge-side of the film that opposes the connection region to the organic light-emitting diode structure layer.

9. The display device according to claim 8, wherein
   a width of the film in a connection region to the FPC is smaller than the width of the film in the region where the integrated circuit is disposed.

10. The display device according to claim 8, wherein
    the organic light-emitting diode structure layer includes a second edge-side region and a third edge-side region that cross the first edge side region,
    the second edge-side region and the third edge-side region are curved, and
    the second edge-side region and the third edge-side region do not overlap the connection region between the FPC and the film in a plan view.

* * * * *